United States Patent
Zhao et al.

(10) Patent No.: US 12,439,537 B2
(45) Date of Patent: Oct. 7, 2025

(54) INFORMATION HANDLING SYSTEM RACK RELEASE LATCH HAVING VERTICAL MOVEMENT IN A LATCHED STATE

(71) Applicant: Dell Products L.P., Round Rock, TX (US)

(72) Inventors: Chen Zhao, Jiangsu (CN); John C. Donachy, Austin, TX (US); Nicholas Lenn Poteracki, Austin, TX (US); Corbett B. Schoenfelt, West Lake Hills, TX (US)

(73) Assignee: Dell Products L.P., Round Rock, TX (US)

(*) Notice: Subject to any disclaimer, the term of this patent is extended or adjusted under 35 U.S.C. 154(b) by 237 days.

(21) Appl. No.: 18/199,485

(22) Filed: May 19, 2023

(65) Prior Publication Data

US 2024/0389250 A1  Nov. 21, 2024

(51) Int. Cl.
*H05K 5/02* (2006.01)
*H05K 7/18* (2006.01)

(52) U.S. Cl.
CPC .......... *H05K 5/023* (2013.01); *H05K 5/0221* (2013.01); *H05K 7/18* (2013.01)

(58) Field of Classification Search
None
See application file for complete search history.

(56) References Cited

U.S. PATENT DOCUMENTS

| | | | |
|---|---|---|---|
| 7,321,489 B2 | 1/2008 | McAlister | |
| 8,976,536 B2 | 3/2015 | French, Jr. | |
| 9,125,318 B2 | 9/2015 | French, Jr. et al. | |
| 9,456,519 B2 | 9/2016 | Bailey et al. | |
| 10,317,949 B1* | 6/2019 | Lin | H05K 5/023 |
| 10,362,707 B2 | 7/2019 | Chiasson et al. | |
| 10,485,123 B1* | 11/2019 | Lin | H05K 5/0221 |
| 10,863,647 B1* | 12/2020 | Escamilla | H05K 5/023 |
| 2003/0002261 A1* | 1/2003 | Berry | H05K 7/1489 |
| | | | 361/727 |
| 2008/0239648 A1* | 10/2008 | Okamoto | G06F 1/183 |
| | | | 361/725 |
| 2011/0279973 A1 | 11/2011 | Terwilliger et al. | |
| 2023/0024568 A1* | 1/2023 | Chen | H05K 5/023 |
| 2024/0040729 A1* | 2/2024 | Li | H05K 7/1487 |

* cited by examiner

*Primary Examiner* — Allen L Parker
*Assistant Examiner* — Christopher L Augustin
(74) *Attorney, Agent, or Firm* — Zagorin Cave LLP; Robert W. Holland (57) ABSTRACT

An information handling system coupled in rails of a rack enclosure is secured in place by a latch managed by a handle coupled to opposing sides of the information handling system housing and disposed across a front face of the housing. When the latch is locked, the handle rotates up and down at the housing front face to offer end user access to components of the information handling system. A latch actuator in the handle unlocks the latch by engaging a cam lock in a pivot plate so that rotation of the handle translates to the pivot plate to release the housing for movement on the rails.

19 Claims, 10 Drawing Sheets

INFORMATION HANDLING SYSTEM RACK RELEASE LATCH HAVING VERTICAL MOVEMENT IN A LATCHED STATE

BACKGROUND OF THE INVENTION

Field of the Invention

The present invention relates in general to the field of information handling systems, and more particularly to an information handling system rack release latch having vertical movement in a latched state with a robust camming handle solution.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems process information with processing components disposed in a housing. In data centers, housings are typically maintained in racks that have static shelfs or rails to slide the housings into the rack during operations and slide the housing out of the rack when maintenance is needed. A typical data center rack holds a wide variety of information handling systems, including server information handling systems that respond to client requests, storage information handling systems that store information to aid in responses to client requests and Storage Compute Nodes that support Common Compute Framework (CCF) and Open Compute Project (OCP) 3.0 HD Next Generation I/O. OCP nodes provide platforms that have high density next generation input/output modules with power supply units (PSU) and thermal management. One difficulty that arises with OCP3.0 HD nodes is that the high power use and thermal heatsink and carrier integration can consume much of the available footprint within the node housing.

Conventional OCP nodes typically have a handle of some sort that a technician can grasp to slide the node into and out of a rack, and also some access to internal components so that maintenance can be performed while the housing remains in the rack. In some instances, the handle is centrally located on the node housing. In other instances, the handle is located on a bottom or top side of the housing. Some node housings have separate handles on both sides that an end user can grasp. The larger footprint and PSU location in the OCP3.0 HD housing allows some room at opposing sides of the housing where a handle can couple to support an end user grasp for sliding the housing into and out of a rack. One difficulty with such a handle that extends across the front side of the housing is that it impedes access to the housing interior unless the housing is released and removed from the rack. This is particularly true where a robust handle is used that will withstand a heavy load associated with a densely pack information handling system node.

SUMMARY OF THE INVENTION

Therefore, a need has arisen for a system and method which adjusts a front positioned handle of an information handling system node to provide access to a front side of the node when installed in a rack.

In accordance with the present invention, a system and method are provided which substantially reduce the disadvantages and problems associated with previous methods and systems for accessing an information handling system node when installed in a rack. A handle coupled to an information handling system has a locked configuration that allows the handle to rotate relative to the housing to provide access to the housing front face and an unlocked configuration in which rotation of the handle unlatches the information handling system housing to slide out of a rack on rails.

More specifically, an information handling system, such as an OCP3.0 HD compliant system, couples to a rack by a rail and secures to the rack with a latch managed by a handle coupled to opposing sides of the information handling system housing. In a locked position, the latch couples the housing to the rails to prevent sliding of the housing out of the rack on the rails. The handle rotates relative to the housing when in the locked position to provide access by an end user to the front face of the information handling system housing. In an unlocked position, the handle engages with the latch to release the housing to slide on the rails when the handle rotates downward. For example, a latch actuator included in the handle actuates to engage a cam lock with a pivot plate of the latch. With the pivot plate engaged by the cam lock, downward rotation of the handle is translated to the pivot plate to rotate the pivot plate, disengaging the node PDC connectors from the system's mating connectors, and then releasing the housing from the rack so that the housing can slide out of the rack by the rails. A side plate moves in response to the latch actuator to hold the latch actuator in the unlocked position while the pivot plate is rotated by the handle. An end user pulls on the handle with the pivot plate rotated to the unlocked position to pull the housing out of the rack on the rails.

The present invention provides a number of important technical advantages. One example of an important technical advantage is that an information handling system node having a dense payload, such as an OCP3.0 HD module, that has handle coupling locations at opposing sides of a housing offers a robust handle and latch configured to pull the housing out of a rack and also to rotate up and down to provide access to modules of the housing when the housing is installed in the rack. An intuitive user interface arrangement allows rotation of the handle when the housing is in the rack to provide access to the front face of the housing and activates a latch to fix the handle in a horizontal orientation when the latch releases the housing so that an end user can pull the housing out of the rack. The ergonomic grab point has a high mechanical advantage for a robust handle operation that optimizes latch engagement and disengagement for high mating force scenarios yet offers intuitive end user interactions to provide access to the housing front face. An end user can easily and safely extract and/or seat a large module/node with a robust method for decoupling high-force internal connectors using this camming handle release and insertion solution in an intuitive manner.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system handle rotates when the information handling system is latched in place at a rack and fixes when the latch is released to provide a firm pull for sliding the information handling system from the rack. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
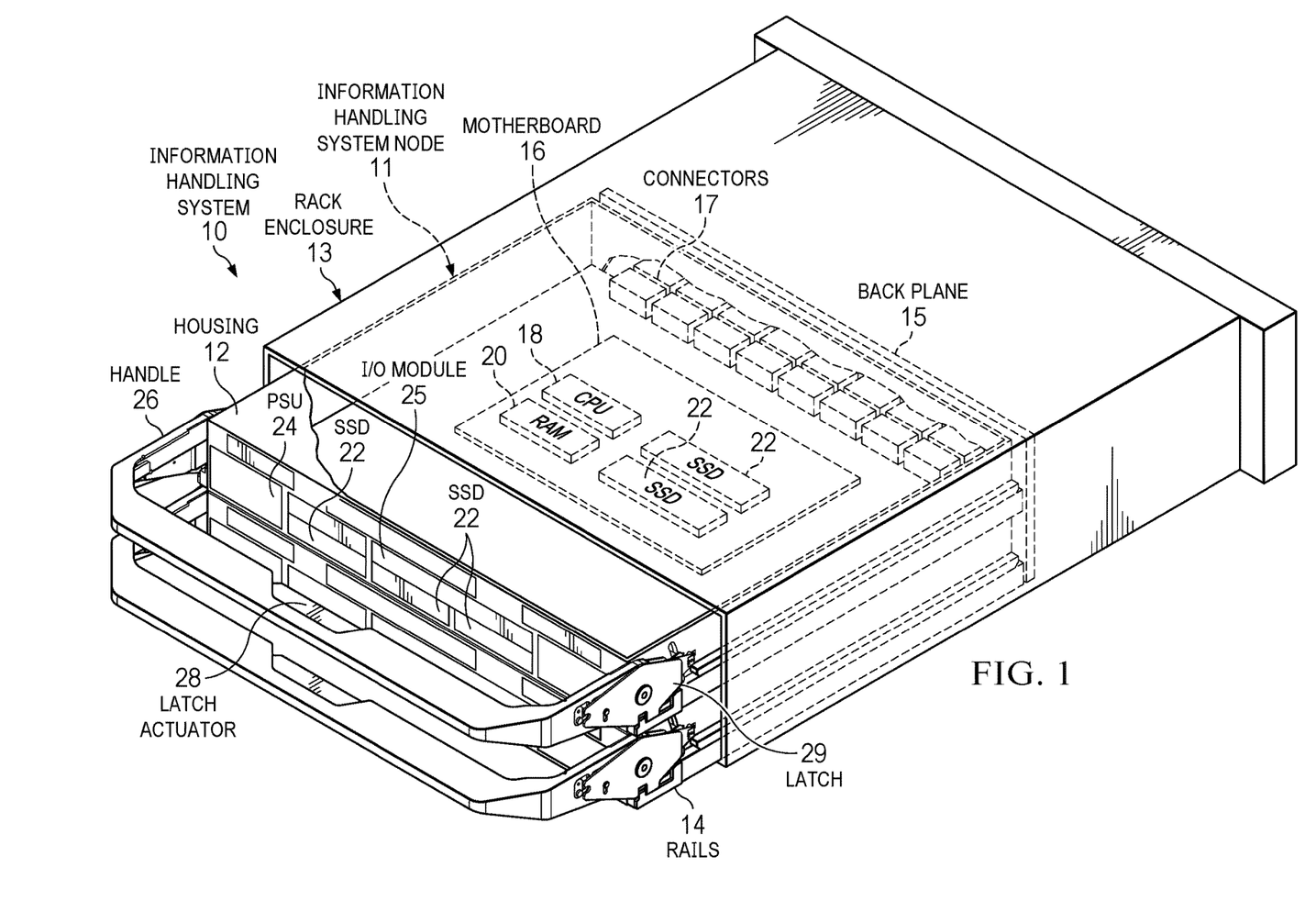
FIG. 1 depicts a side perspective view of information handling systems installed in internal housing rails within the primary information handling system housing and latched in place by a handle that rotates to provide access to a front face of the information handling system.

Referring now to FIG. 1, a side perspective view depicts an information handling system 10 installed in internal housing rails 14 within the information handling system node 11 and latched in place by a handle 26 that rotates to provide access to a front face of the information handling system node 11. Information handling system 10 is a rack enclosure 13 with multiple information handling system nodes 11, each having processing components that cooperate to process information. In the example embodiment, a housing 12 of each information handling system node 11 includes a variety of processing components that cooperate to process information, such as a motherboard 16 that interfaces a central processing unit (CPU) 18, random access memory (RAM) 20 and plural solid state drives (SSD) 22. For instance, information handling system 10 is built in a rack enclosure 13 having plural information handling system nodes 11, each node an OCP3.0 HD storage module that processes information and supports network communication. Each housing 12 has associated connectors 17 that insert into a backplane 15 of rack enclosure 13 when the housing is slide on rails 14 into an installed position. In various embodiments, various types of arrangements may be used to slide each housing into and out of the enclosure, including a simple shelf that lacks rails, rails coupled to the housing and/or rails coupled to the enclosure. When a housing connector couples to a backplane, an end user typically has to apply a substantial separation force to pull the housing out of the enclosure. At a front face of housing 12, a power supply unit 24, plural SSDs 22 and plural input/output (I/O) modules 25 are accessible to an end user, such as for maintenance or replacement. A handle 26 couples to opposing sides of housing 12 with a latch 29 that is actuated by a latch actuator 28. When latch 29 is engaged at rails 14, housing 12 is secured in place to prevent extraction from the rack. In the secured configuration, handle 26 rotates up and down by ten degrees (or greater in alternative embodiments) to provide an end user with access at the front face of housing 12 so that the end user can perform maintenance on processing components of the front face of information handling system 10. When an end user desires to remove information handling system 10, latch 29 is actuated by handle 26 latch actuator 28 so that rotation of handle 26 downward releases the housing to slide out on rails 14 and remove from the rack with a pull on handle 26. Although the example embodiment operates on an OCP3.0 HD module, other embodiments may include other types of server information handling systems.

Figure 2:
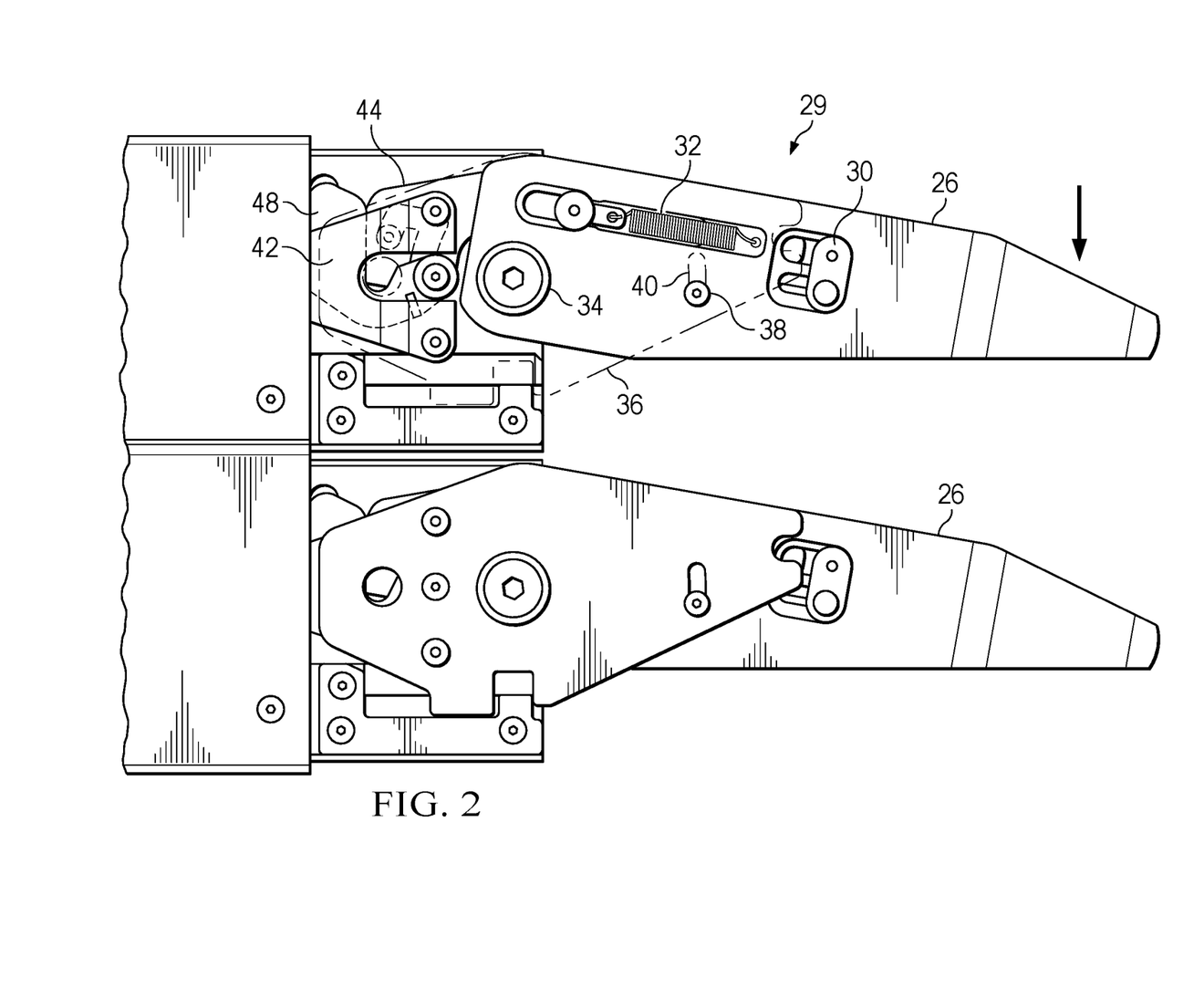
FIG. 2 depicts a side view of an example embodiment of the handle and latch with the latch secured and the handle free to rotate vertically relative to the front face of the information handling system.

Referring now to FIG. 2, a side view depicts an example embodiment of the handle 26 and latch 29 with the latch secured and the handle free to rotate vertically relative to the front face of the information handling system. A cam lock 30 is in an unlocked position relative to a pivot plate 36 that is rotationally coupled at a pivot 34, such as a screw. A slot 40 in pivot plate 36 defines a rotational range of handle 26 by interaction with a pin 38. A spring 32 biases handle 26 to rotate upward to a level orientation and gives way when handle 26 is pressed down by an end user so that the end user can have unimpeded access to the front of the information handling system. In alternative embodiments, greater or less degrees of rotation may be supported and rotation above a horizontal orientation may be supported by adjusting the slot orientation.

Although handle 26 is free to rotate relative to the front face of the information handling system, latch 30 remains in a locked position so that the information handling system will not extend from the rail. A track system 42 manages interactions between a side plate 44 and cam security lock 46 to engage the latch with the rack rail, as described in greater detail below. In the example embodiment, cam lock 46 is in a locked position so that rotation of handle 26 does not translate to movement of the information handling system at the rail until the latch is released.

Figure 3:
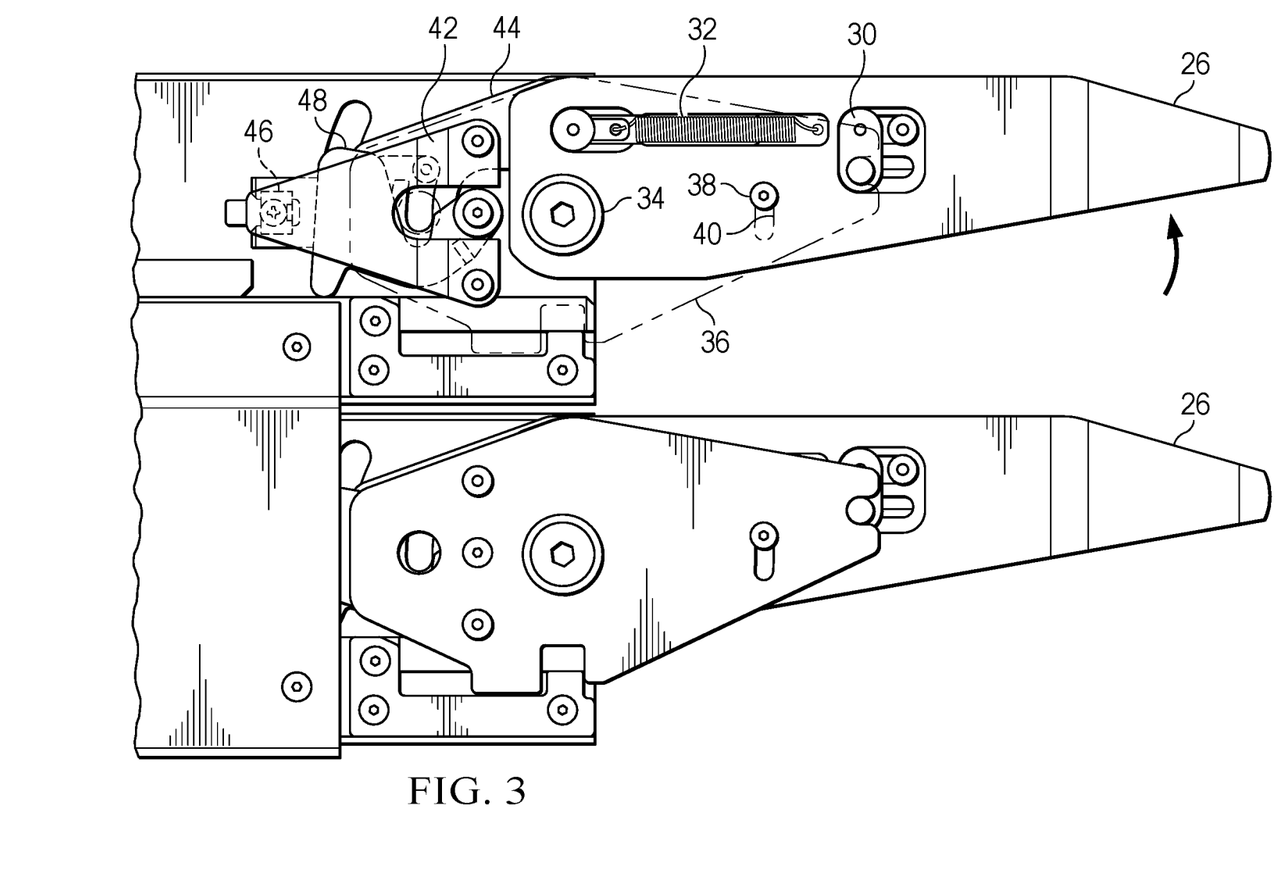
FIGS. 3, 3A and 3B depict a side view of the cam lock engaged with the pivot plate in preparation for releasing the latch to extend the information handling system from the rack rails.
Figure 3A:
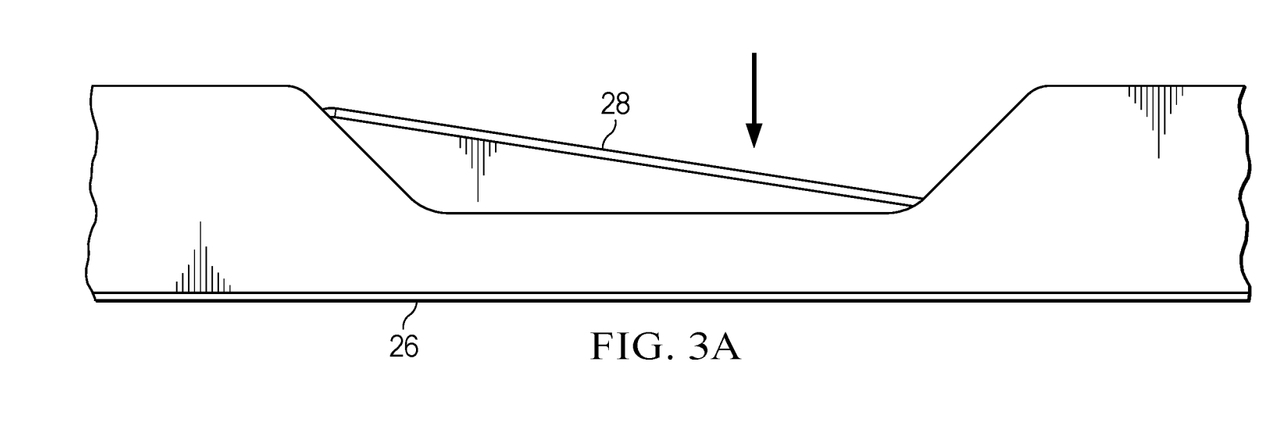
Figure 3B:
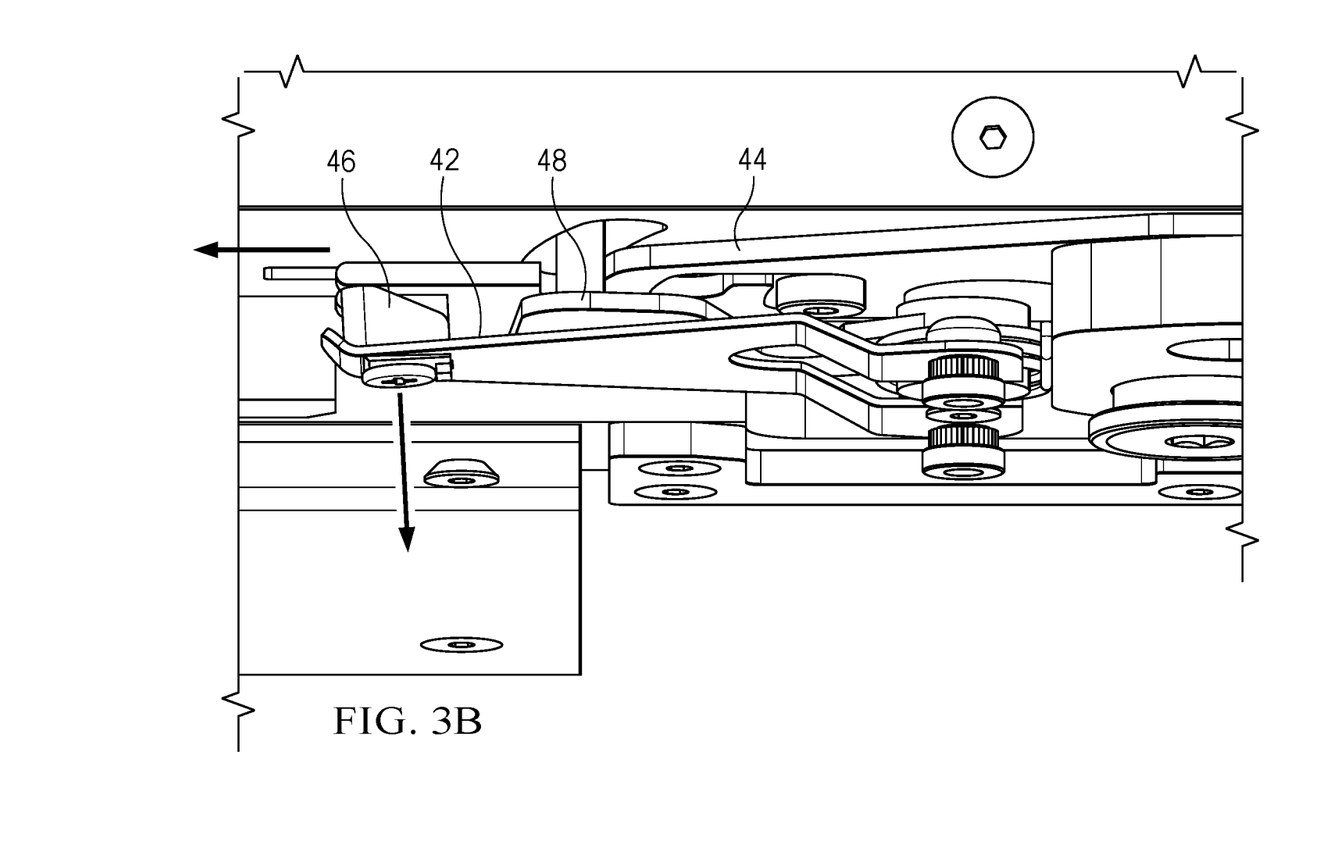

Referring now to FIGS. 3, 3A and 3B, a side view depicts cam lock 30 engaged with pivot plate 36 in preparation for releasing the latch to extend the information handling system from the rack rails. To prepare for release of the latch, handle 26 is raised to an upright orientation with pin 38 at the upper limit of slot 40 and pivot plate 36 rotated up about pivot 34. As shown by FIG. 3A, in the raised position of handle 26 the latch actuator 28 is depressed to mechanically translate to cam lock 30 to enter a locked position relative to pivot plate 36. As is described below in greater detail, cam lock 30 is coupled with side plate 44 through track system 42, which enters a slot position of a side plate lock 48 to allow handle 26 to rotate 20 degrees with cam security lock 46 moved to an unlocked position by latch actuator 28. Cam security lock 46 is pushed into the unlocked position by side plate 44 to allow the latch to rotate and side plate lock 48 notches into side plate 44 to lock latch actuator 28 into the depressed or actuated position. FIG. 3B depicts a top view of the engagement of cam security lock 46 released by side plate 44 with side plate lock 48 engaged to track system 42 so that latch actuator 28 is retained in the depressed position.

Figure 4:
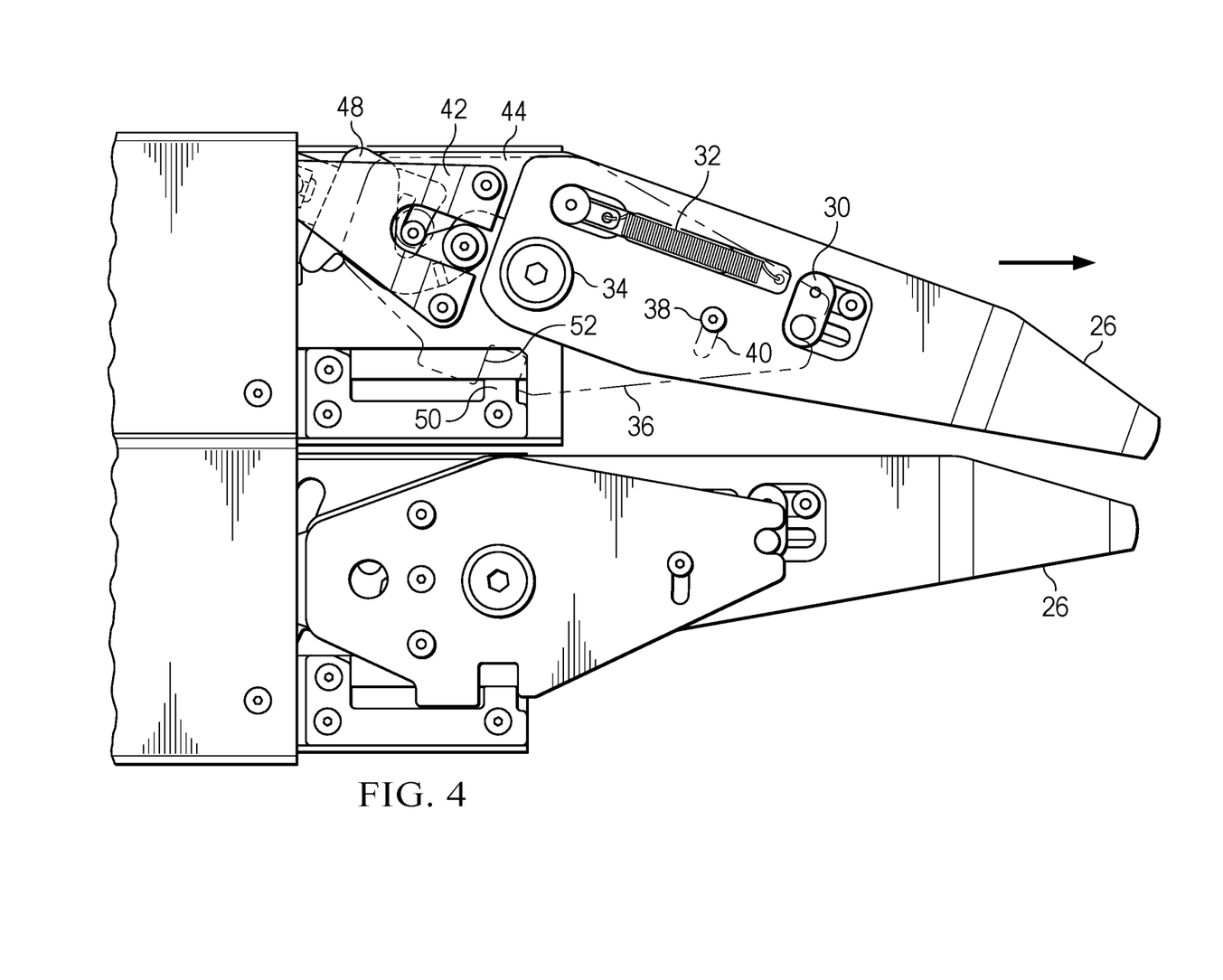
FIG. 4 depicts a side view of the handle engaged with the latch to free the pivot plate from an engagement point of the rail and release the information handling system to extend from the rack.

Referring now to FIG. 4, a side view depicts handle 26 engaged with the latch to free the pivot plate 36 from an engagement point 50 of the rail and release the information handling system to extend from the rack. With cam lock 30 inserted into and engaged with pivot plate 36, a downward press on handle 26 rotates pivot plate 36 about pivot 34 to extract an engagement slot 52 at the bottom side of pivot plate 36 from engagement point 50 so that pulling on handle 26 results in sliding of the information handling system on the rails and out of the rack. In the example embodiment, engagement slot 52 and engagement point 50 are formed as a gear and tooth that release in response to a cam action of pivot plate 36 in response to rotation by handle 26. Track system 42, side plate 44 and side plate lock 48 cooperate to maintain the latch actuator in the release position while pivot plate 36 rotates to the release position.

Figure 5:
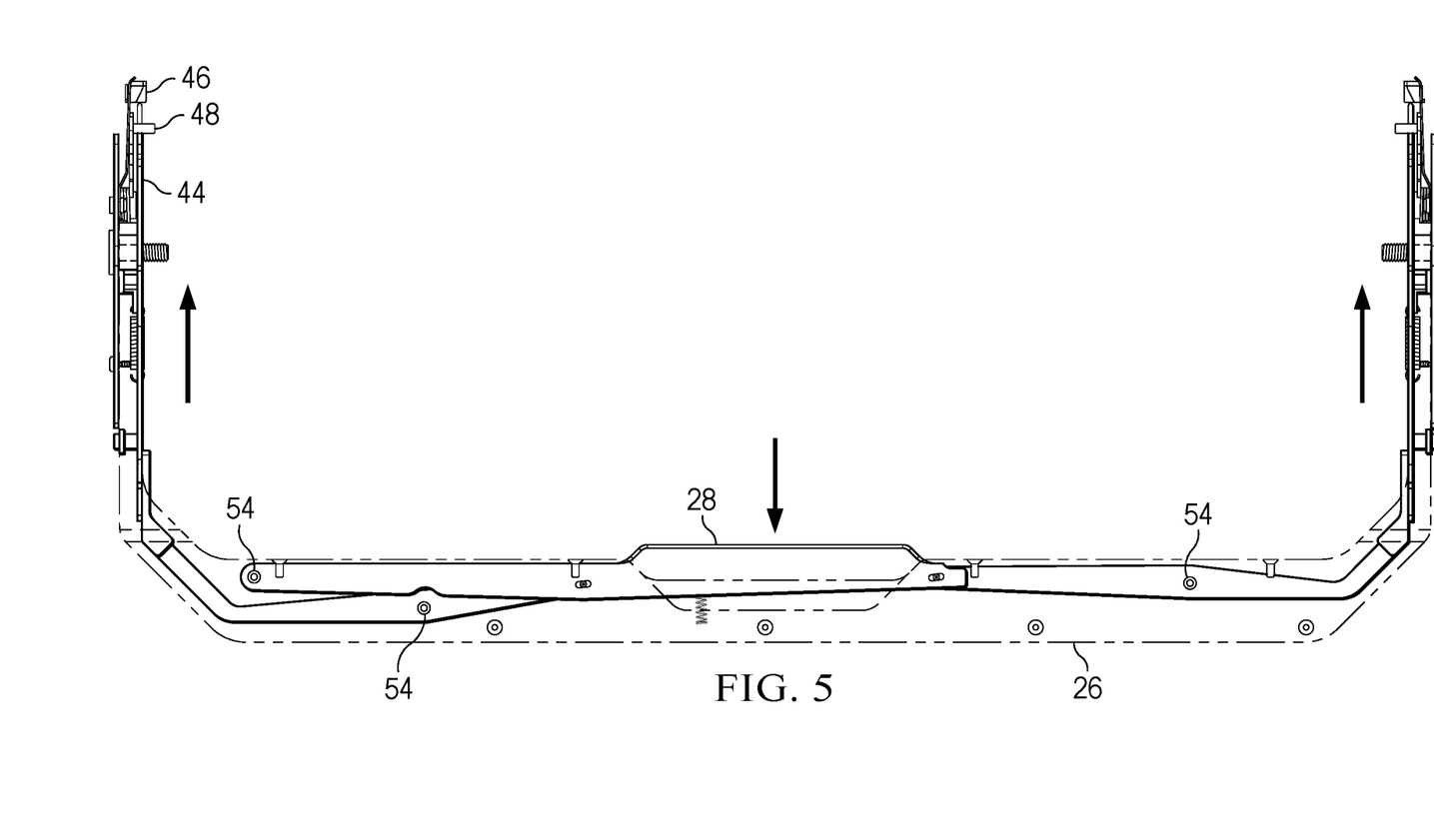
FIGS. 5, 5A and 5B depict a top view of the handle and latch actuator illustrating how latch actuation translates to the side plate and side plate lock to maintain the latch actuator position during removal of the information handling system.
Figure 5A:
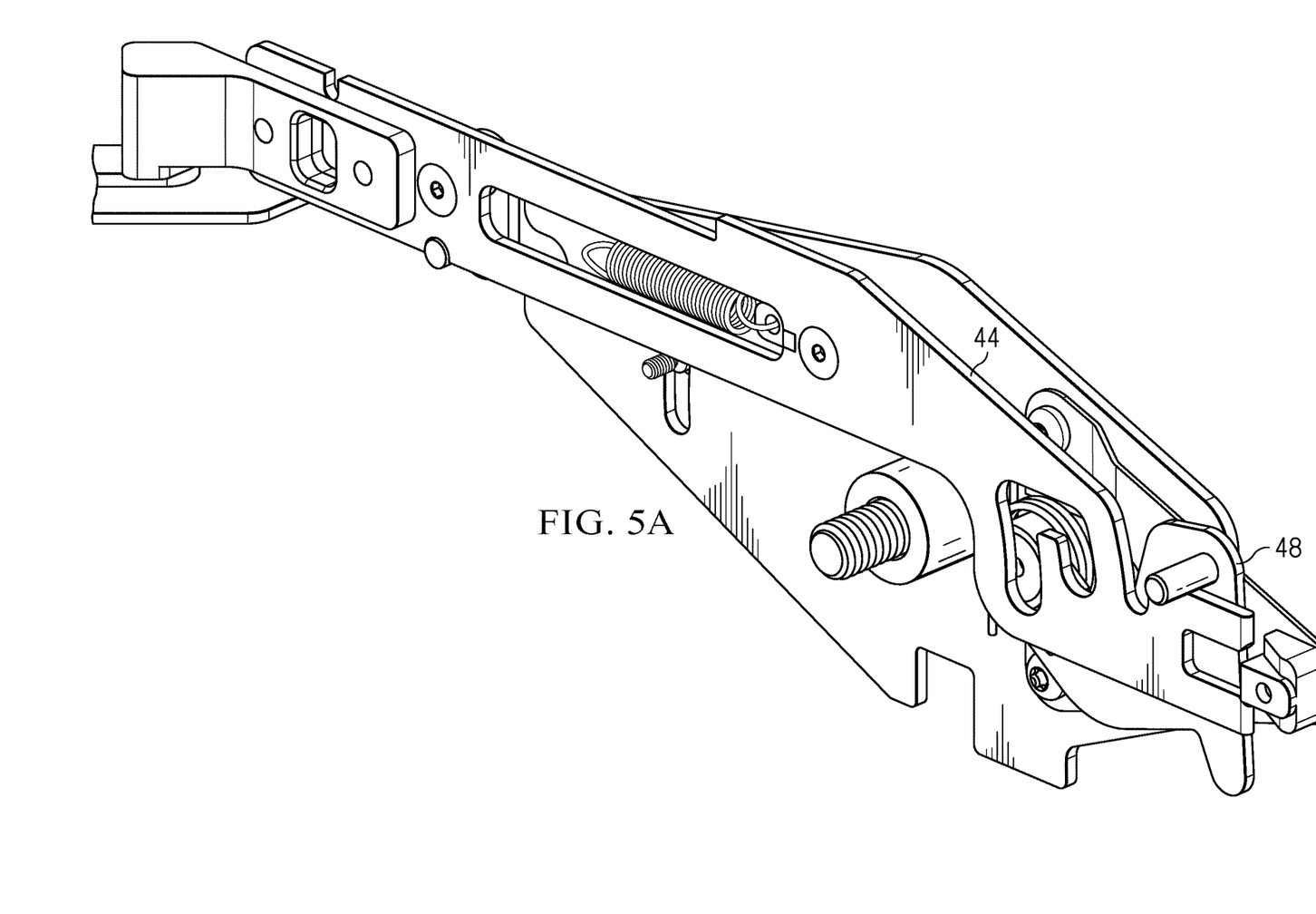
Figure 5B:
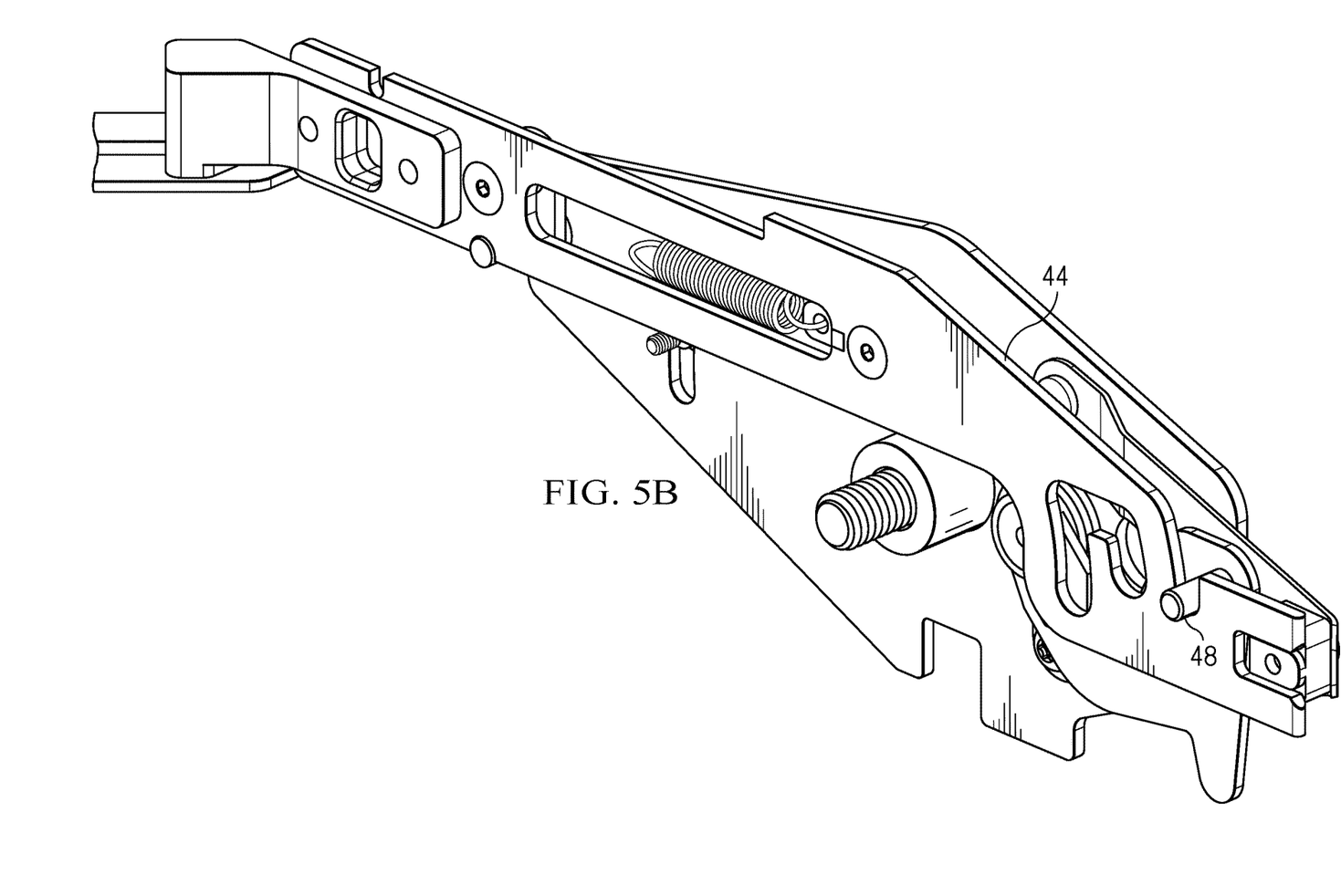

Referring now to FIGS. 5, 5A and 5B, a top view of the handle and latch actuator depicts how latch actuation translates to the side plate and side plate lock to maintain the latch actuator position during removal of the information handling system. When latch actuator 28 is pressed inward at handle 26, the inward movement is translated by plural pivot points 54 to press out on side plate 44 so that side plate lock 48 engages in a slot of side plate 44 and cam security lock releases from the rack to allow rotation of the pivot plate in response to a downward press on handle 26. FIG. 5A depicts side plate 44 in a forward position with the latch actuator not actuated and showing side plate lock 48 out of the notch formed in side plate 44. FIG. 5B depicts side plate 44 slid rearward towards the information handling system when the latch actuator actuates so that side plate lock 48 inserts into the notch of side plate 44 while the end of side plate 44 engages with cam security lock 46. This arrangement retains the latch actuator in the actuated position while engaging the pivot plate to the handle so that rotation of the handle pivots the pivot plate and releases the information handling system slide on the rails out of the rack.

Figure 6:
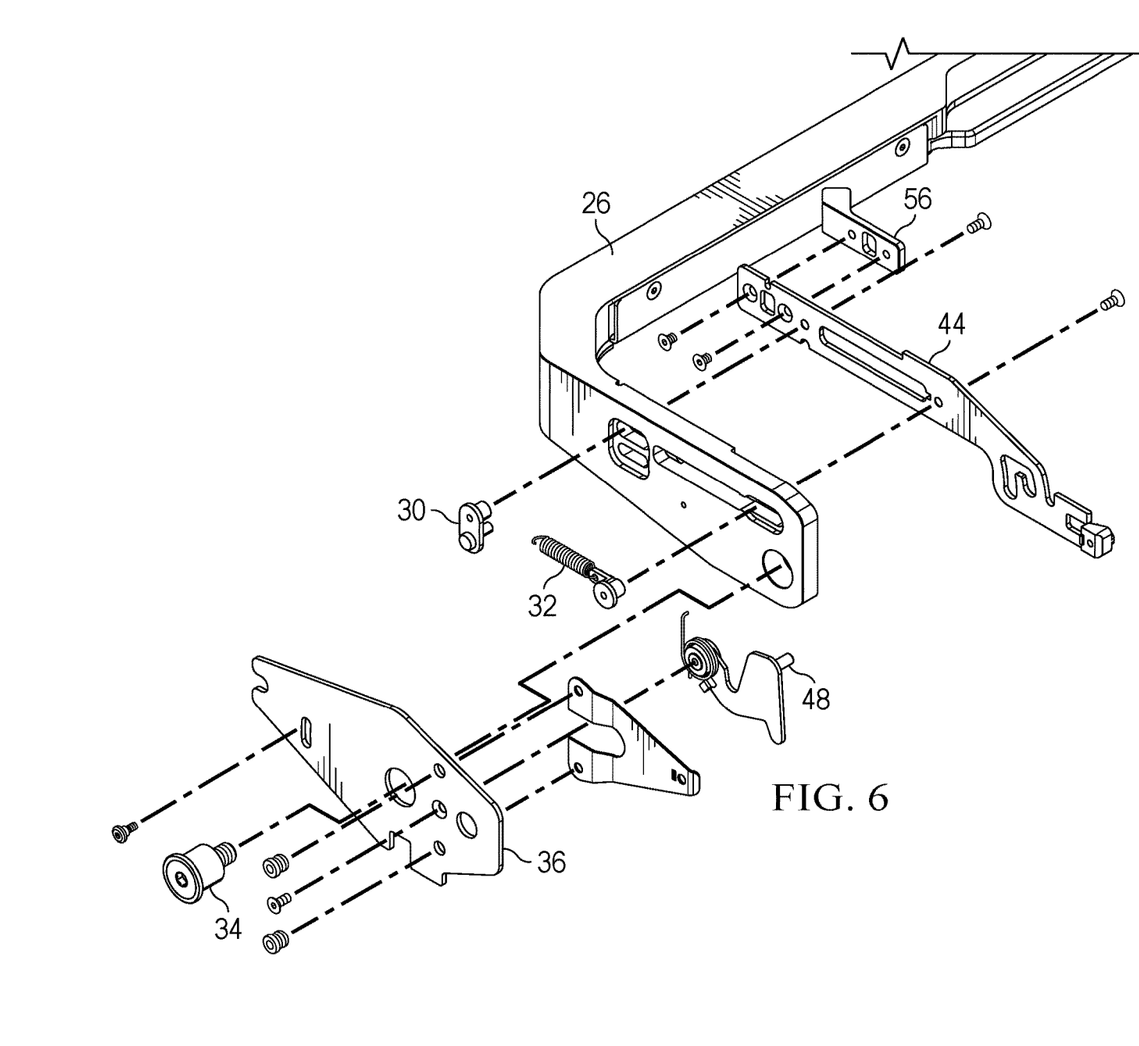
FIG. 6 depicts a side exploded view of the handle as an example of parts that assemble to transition a handle from freely rotating to engaging and releasing a latch so that a housing may be pulled out of a rack by the handle.

Referring now to FIG. 6, a side exploded view of the handle 26 depicts an example of parts that assemble to transition a handle from freely rotating to engaging and releasing a latch so that a housing may be pulled out of a rack by the handle. Pivot 34 fits through pivot plate 36 as a threaded nut that engages in pivot plate 36 and with handle 26. Cam lock 30 couples to spring 32 and handle 26 through side plate 44 so that actuation of the latch actuator engages cam lock 30 into the end of pivot plate 36. Track system 42 and side plate lock 48 engage with side plate 44 to manage the actuation latch position when pivot plate 36 rotates with the latch to release the information handling system to slide outward on the rail. Side plate 44 interfaces with the actuation latch through a connector 56.

Although the present invention has been described in detail, it should be understood that various changes, substitutions and alterations can be made hereto without departing from the spirit and scope of the invention as defined by the appended claims.

What is claimed is:

1. An information handling system comprising:
   a rail;
   a housing slidingly coupled to the rail;
   a processor disposed in the housing and operable to execute instructions to process information;
   a memory disposed in the housing and operable to store the instructions and information;
   a handle coupled to and extending from a front side of the housing, the handle having a locked position that retains the housing in a rack and an unlocked position that releases the housing to slide out of the rack, the handle rotating vertically relative to the housing when in the unlocked position to provide access to the front side of the housing;
   a latch actuator disposed in the handle and moving between an unlocked position and a locked position;
   a pivot plate rotationally coupled to the handle; and
   a cam lock interfaced with the latch actuator that engages the pivot plate when the latch actuator moves to the unlocked position so that the handle rotates the pivot plate when rotating vertically when the cam lock engages with the pivot plate.

2. The information handling system of claim 1 further comprising:
   an engagement point aligned with an engagement slot of the pivot plate to prevent sliding of the housing on the rails;
   wherein the engagement point releases from the engagement slot when the handle rotates with the cam lock engaged in the pivot plate.

3. The information handling system of claim 2 wherein the housing includes a power supply unit accessible at a front face of the housing.

4. The information handling system of claim 3 wherein the housing includes an input/output module accessible at a front face of the housing.

5. The information handling system of claim 4 wherein the housing has an OCP3.0 compliant configuration.

6. The information handling system of claim 2 further comprising:
   a side plate interfaced with the latch actuator; and
   a side plate lock configured to engage the side plate when the latch actuator moves to the unlocked position to hold the latch actuator in the unlocked position while the handle rotates to release the pivot plate engagement slot from the engagement point.

7. The information handling system of claim 6 further comprising a spring coupled to the pivot plate and the handle to bias the handle upwards when the cam lock is in an unlocked position.

8. The information handling system of claim 7 further comprising:
a pin extending from the handling through the pivot plate;
wherein the pin engages through a slot of the pivot plate to define a rotation range of the handle when the cam lock is in the unlocked position.

9. A method for managing access to an information handling system housing front face and releasing the information handling system housing to extend on rails, the method comprising:
coupling a handle to each of opposing sides of the housing, the handle extending across the front face of the housing;
rotating the handle up and down in front of the housing while remaining in a locked configuration to access the housing front face while remaining in the locked configuration, the locked configuration preventing the housing from extending on the rails; and
engaging a latch of the handle that releases the housing to extend on the rails when the handle is rotated down.

10. The method of claim 9 further comprising:
actuating the latch at the handle; and
translating the actuating from the handle to a cam lock that engages with a pivot plate.

11. The method of claim 10 further comprising:
translating the handle rotation down with the cam lock engaged to rotate the pivot plate; and
in response to rotation of the pivot plate, releasing an engagement point from an engagement slot to release the housing to extend on the rails.

12. The method of claim 11 further comprising:
translating the actuating to a side plate; and
engaging the side plate with a side plate lock to hold the latch in an actuated position.

13. The method of claim 12 wherein the information handling system comprises an Open Computer Project (OCP) 3.0 device.

14. The method of claim 12 wherein the information handling system comprises plural storage drives accessible at the front face when the handle rotates in the locked configuration.

15. The method of claim 12 wherein the information handling system comprises an input/output module accessible at the front face when the handle rotates in the locked configuration.

16. An information handling system housing mounted on rails comprising:
a handle configured to couple to and extend at a front side of the housing, the handle having a locked position that retains the housing in place on the rails and an unlocked position that releases the housing to slide out on the rails, the handle rotating vertically relative to the housing when in the unlocked position to provide access to the front side of the housing; and
a pivot plate disengaged from the handle in the locked position and engaged with the handle in the unlocked position to translate rotation of the handle to release the housing to slide out on the rails.

17. The information handling system housing of claim 16 further comprising:
a latch actuator included in the housing and having locked and unlocked positions; and
a cam lock interfaced with the latch actuator to engage the pivot plate when the latch actuator is in the locked position.

18. The information handling system housing of claim 17 further comprising:
an engagement point aligned with an engagement slot of the pivot plate to prevent sliding of the housing on the rails;
wherein the engagement point releases from the engagement slot when the handle rotates with the cam lock engaged in the pivot plate.

19. The information handling system housing of claim 18 further comprising:
a side plate interfaced with the latch actuator; and
a side plate lock configured to engage the side plate when the latch actuator moves to the unlocked position to hold the latch actuator in the unlocked position while the handle rotates to release the pivot plate engagement slot from the engagement point.

* * * * *

UNITED STATES PATENT AND TRADEMARK OFFICE
CERTIFICATE OF CORRECTION

| | | |
|---|---|---|
| PATENT NO. | : 12,439,537 B2 | Page 1 of 1 |
| APPLICATION NO. | : 18/199485 | |
| DATED | : October 7, 2025 | |
| INVENTOR(S) | : Chen Zhao et al. | |

It is certified that error appears in the above-identified patent and that said Letters Patent is hereby corrected as shown below:

In the Claims

In Column 7, Claim 8, Line 7, please replace "handling" with --handle--.

Signed and Sealed this
Sixteenth Day of December, 2025

John A. Squires
*Director of the United States Patent and Trademark Office*